United States Patent
Stamper et al.

(10) Patent No.: US 11,658,177 B2
(45) Date of Patent: May 23, 2023

(54) SEMICONDUCTOR DEVICE STRUCTURES WITH A SUBSTRATE BIASING SCHEME

(71) Applicant: GLOBALFOUNDRIES U.S. Inc., Santa Clara, CA (US)

(72) Inventors: Anthony K. Stamper, Williston, VT (US); Michel J. Abou-Khalil, Essex Junction, VT (US); John J. Ellis-Monaghan, Grand Isle, VT (US); Randy Wolf, Essex Junction, VT (US); Alvin J. Joseph, Williston, VT (US); Aaron Vallett, Jericho, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 41 days.

(21) Appl. No.: 17/113,473

(22) Filed: Dec. 7, 2020

(65) Prior Publication Data

US 2022/0181317 A1 Jun. 9, 2022

(51) Int. Cl.
*H01L 27/02* (2006.01)
*H01L 29/06* (2006.01)

(52) U.S. Cl.
CPC ...... *H01L 27/0285* (2013.01); *H01L 27/0218* (2013.01); *H01L 29/0619* (2013.01); *H01L 29/0649* (2013.01)

(58) Field of Classification Search
CPC ............. H01L 27/0285; H01L 27/0218; H01L 29/0619; H01L 29/0649
See application file for complete search history.

(56) References Cited

U.S. PATENT DOCUMENTS

| | | | |
|---|---|---|---|
| 5,723,896 A | * | 3/1998 | Yee .................. H01L 21/26506 257/E21.564 |
| 5,838,047 A | | 11/1998 | Yamauchi et al. |
| 6,804,502 B2 | | 10/2004 | Burgener et al. |
| 8,735,993 B2 | | 5/2014 | Lo et al. |
| 9,548,351 B2 | | 1/2017 | Kjar |

(Continued)

FOREIGN PATENT DOCUMENTS

| | | |
|---|---|---|
| KR | 1020100015485 A | 2/2010 |
| KR | 1020130088704 A | 8/2013 |

(Continued)

OTHER PUBLICATIONS

A. Joseph et al., "Power handling capability of an SOI RF switch," 2013 IEEE Radio Frequency Integrated Circuits Symposium (RFIC), Seattle, WA, 2013, pp. 385-388.

(Continued)

*Primary Examiner* — Khaja Ahmad
(74) *Attorney, Agent, or Firm* — Thompson Hine LLP; David Cain

(57) ABSTRACT

Semiconductor device structures with substrate biasing, methods of forming a semiconductor device structure with substrate biasing, and methods of operating a semiconductor device structure with substrate biasing. A substrate contact is coupled to a portion of a bulk semiconductor substrate in a device region. The substrate contact is configured to be biased with a negative bias voltage. A field-effect transistor includes a semiconductor body in the device region of the bulk semiconductor substrate. The semiconductor body is electrically isolated from the portion of the bulk semiconductor substrate.

9 Claims, 3 Drawing Sheets

(56) References Cited

U.S. PATENT DOCUMENTS

| | | | |
|---|---|---|---|
| 10,283,584 B2 | 5/2019 | Zaka et al. | |
| 10,680,080 B2 | 6/2020 | Lee et al. | |
| 2001/0006243 A1* | 7/2001 | Morishita | H01L 27/0251 |
| | | | 257/360 |
| 2009/0108355 A1 | 4/2009 | Cai et al. | |
| 2011/0039387 A1* | 2/2011 | Wei | H01L 29/66659 |
| | | | 438/289 |
| 2012/0112285 A1 | 5/2012 | Cai et al. | |
| 2015/0221629 A1* | 8/2015 | Besse | H01L 21/823418 |
| | | | 257/140 |
| 2017/0104075 A1* | 4/2017 | Nagy | H03F 3/193 |
| 2019/0057970 A1 | 2/2019 | Sun et al. | |
| 2020/0020766 A1* | 1/2020 | Seacrist | H01L 23/66 |

FOREIGN PATENT DOCUMENTS

| | | |
|---|---|---|
| KR | 102051752 B1 | 1/2020 |
| TW | 201814912 A | 4/2018 |

OTHER PUBLICATIONS

Taiwan Intellectual Property Office, Examination Report received Nov. 4, 2022 in Taiwanese Patent Application No. 110141360, 9 pages.

Korean Intellectual Property Office, Office Action received Mar. 14, 2023 in Korean Patent Application No. 10-2021-0148476, 10 pages.

* cited by examiner

SEMICONDUCTOR DEVICE STRUCTURES WITH A SUBSTRATE BIASING SCHEME

BACKGROUND

The present invention relates to semiconductor device fabrication and integrated circuits and, more specifically, to semiconductor device structures with substrate biasing, methods of forming a semiconductor device structure with substrate biasing, and methods of operating a semiconductor device structure with substrate biasing.

Device structures, such as field-effect transistors, are susceptible to exhibiting high capacitance and body-to-body leakage when formed using a bulk semiconductor substrate. A measure that may be taken to reduce the susceptibility is to provide the bulk semiconductor substrate with triple well isolation that isolates the transistor body from the substrate. However, a transistor switch with triple well isolation may exhibit poor linearity. Another measure that may be taken to reduce the susceptibility is to replace the bulk semiconductor substrate with a silicon-on-insulator (SOI) substrate in which a thin top silicon layer furnishes an active region and a buried oxide layer is arranged between the active region and a handle substrate beneath the buried insulator layer. The buried oxide layer isolates the transistor body from the handle substrate, but a silicon-on-insulator substrate is costly.

Improved semiconductor device structures with substrate biasing, methods of forming a semiconductor device structure with substrate biasing, and methods of operating a semiconductor device structure with substrate biasing are needed.

SUMMARY

In an embodiment of the invention, a structure includes a substrate contact coupled to a portion of a bulk semiconductor substrate in a device region. The substrate contact is configured to be biased with a negative bias voltage. The structure further includes a field-effect transistor including a semiconductor body in the device region of the bulk semiconductor substrate. The semiconductor body is electrically isolated from the portion of the bulk semiconductor substrate.

In an embodiment of the invention, a method includes forming a substrate contact coupled to a portion of a bulk semiconductor substrate in a device region, and forming a field-effect transistor that includes a semiconductor body in the device region of the bulk semiconductor substrate. The semiconductor body that is electrically isolated from the portion of the bulk semiconductor substrate, and the substrate contact is configured to be biased with a negative bias voltage.

In an embodiment of the invention, a method includes applying a negative bias voltage to a portion of a semiconductor substrate in a device region. A field-effect transistor in the device region includes a semiconductor body that is electrically isolated from the portion of the bulk semiconductor substrate to which the negative bias voltage is applied.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
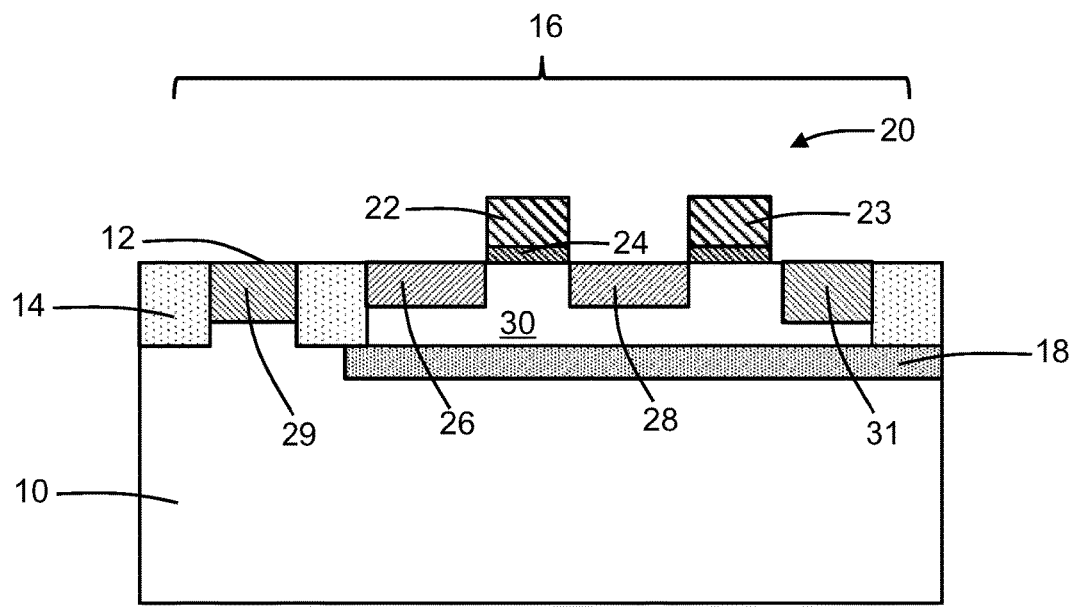
FIG. 1 is a cross-sectional view of a structure for a field-effect transistor in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 may be a bulk substrate (i.e., a non-silicon-on-insulator substrate) containing single-crystal semiconductor material (e.g., single-crystal silicon). As used herein, a non-silicon-on-insulator substrate (i.e., a non-SOI) substrate) lacks a buried oxide layer. The single-crystal semiconductor material of the semiconductor substrate 10 may contain a finite level of defectivity and still be considered single crystal. In an embodiment, the semiconductor substrate 10 may be a high-resistivity bulk substrate containing single-crystal silicon having an electrical resistivity greater than or equal to 1,000 ohm-cm. In an embodiment, the semiconductor substrate 10 may be a high-resistivity bulk substrate containing single-crystal silicon having an electrical resistivity within a range from about 1,000 ohm-cm to about 50,000 ohm-cm. In an embodiment, the semiconductor substrate 10 may contain single-crystal semiconductor material that is lightly-doped with a p-type dopant (e.g., boron) to provide p-type electrical conductivity.

Shallow trench isolation regions 14 are formed that extend from a top surface 12 of the semiconductor substrate 10 to a shallow depth into the semiconductor substrate 10. The shallow trench isolation regions 14 may contain a dielectric material deposited by chemical vapor deposition into trenches patterned in the semiconductor substrate 10, polished, and deglazed. The dielectric material contained in the shallow trench isolation regions 14 may be silicon dioxide, silicon nitride, silicon carbide, silicon-rich silicon dioxide, low-K SiCOH, or a combination of two or more of these materials. The shallow trench isolation regions 14 surround a device region 16.

An isolation layer 18 may be positioned in the semiconductor substrate 10 beneath the device region 16. The isolation layer 18 may be coextensive with the shallow trench isolation regions 14. In an embodiment, the isolation layer 18 may contain polycrystalline semiconductor material layer having an electrical resistivity that is greater than the electrical resistivity of the single-crystal semiconductor material of the semiconductor substrate 10. In an embodiment, the isolation layer 18 may have an electrical resistivity that is greater than or equal to 1,000 ohm-cm. In an embodiment, the electrical resistivity of the isolation layer 18 may be within a range of about 10,000 ohm-cm to about 1,000,000 ohm-cm. In an embodiment, the single-crystal semiconductor material of the semiconductor substrate 10 may have an electrical resistivity within a range about 1,000 ohm-cm to about 10,000 ohm-cm, and the isolation layer 18 may have an electrical resistivity that is about 10 times to about 100 times greater (i.e., within a range of about 10,000 ohm-cm to about 1,000,000 ohm-cm).

In an embodiment, the isolation layer 18 may be formed by forming damaged or amorphous semiconductor material in the semiconductor substrate 10 beneath a top surface 12 of the semiconductor substrate 10 and converting at least a portion of the damaged semiconductor material into polycrystalline semiconductor material. The damaged or amorphous semiconductor material may be formed in the semiconductor substrate 10 by an ion implantation process implanting, for example, argon ions, and the conversion to polycrystalline semiconductor material may be accomplished by performing a thermal treatment (i.e., an annealing process). In an embodiment, the thermal treatment may involve rapid thermal processing at, for example, 1000° C. for less than 10 seconds. In an embodiment, the thermal treatment recrystallizes the semiconductor surface and leaves a polysilicon layer embedded below the surface as the isolation layer 18.

A field-effect transistor 20 may be formed by bulk (i.e. non-SOI) substrate complementary-metal oxide-semiconductor (CMOS) processes as a semiconductor device structure in the device region 16 of the semiconductor substrate 10. The field-effect transistor 20 may include a gate electrode 22 comprised of a conductor, such as doped polycrystalline silicon (i.e., doped polysilicon) or a work function metal, and a gate dielectric 24 comprised of an electrical insulator, such as silicon dioxide or hafnium oxide. The gate electrode 22 and associated gate dielectric 24 may be formed by depositing a layer stack and patterning the layer stack with photolithography and etching processes. The field-effect transistor 20 may further include halo regions, lightly-doped drain extensions, a semiconductor body 30 provided by a portion of the semiconductor substrate 10, a source region 26, a drain region 28, and sidewall spacers on the gate electrode 22. A body contact 31 is coupled to the portion of the semiconductor substrate 10 providing the semiconductor body 30, and a substrate contact 29 is coupled to a portion of the semiconductor substrate 10 that is electrically isolated from the semiconductor body 30 by the isolation layer 18 and shallow trench isolation regions 14.

The source region 26 and drain region 28 are doped to have an opposite conductivity type from the semiconductor substrate 10 and semiconductor body 30. In an embodiment, the field-effect transistor 20 may be an n-type field-effect transistor. In that instance, the source region 26 and drain region 28 may contain semiconductor material doped with an n-type dopant (e.g., arsenic, antimony, and/or phosphorus) to provide n-type electrical conductivity, and the semiconductor substrate 10, substrate contact 29, semiconductor body 30, and body contact 31 may contain semiconductor material doped with a p-type dopant (e.g., boron or indium) to provide p-type electrical conductivity. In alternative embodiments, the polarity of the dopant types may be swapped such that the field-effect transistor 20 is a p-type field-effect transistor instead of an n-type field-effect transistor. In an embodiment, the source region 26 and drain region 28 may be formed by ion implantation, and the substrate contact 29 and body contact 31 may be formed by a separate ion implantation. In an embodiment, a gate electrode 23 is provided to separate the doping of the drain region 28 from the doping of the body contact 31. In an embodiment, the gate electrodes 22, 23 block the implantations forming the source region 26, the drain region 28, and the body contact 31 from doping the semiconductor body 30. In an embodiment, the gate electrodes 22, 23 may partially block the implantations forming the source region 26, the drain region 28, and the body contact 31 from doping the semiconductor body 30.

The field-effect transistor 20 does not include triple-well isolation. Instead, the isolation layer 18 and shallow trench isolation regions 14 electrically isolate the portion of the semiconductor substrate 10 providing the semiconductor body 30 from the portion of the semiconductor substrate 10 that is coupled to the substrate contact 29. The substrate contact 29 is electrically isolated from the semiconductor body 30 by one of the shallow trench isolation regions 14.

In an embodiment, the field-effect transistor 20 may be configured with a thicker gate dielectric 24 to function as a field-effect transistor switch and, in an embodiment, as an n-type field-effect transistor switch. In an embodiment, the thickness of the gate dielectric 24 for a field-effect transistor switch may range from 3 nanometers to 10 nanometers. In an embodiment, the field-effect transistor 20 may be configured with a thinner gate dielectric 24 to function in a low-noise amplifier. In an embodiment, the thickness of the gate dielectric 24 for a low-noise amplifier may range from 1 nanometers to 10 nanometers.

Figure 2:
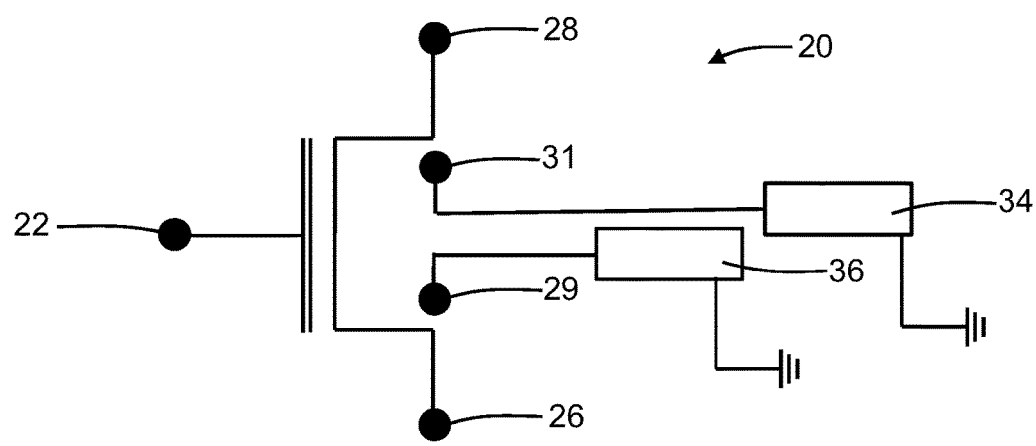
FIG. 2 is a circuit schematic of the field-effect transistor of FIG. 1.

With reference to FIG. 2 in which like reference numerals refer to like features in FIG. 1 and in accordance with embodiments of the invention, a power supply 34 is coupled to the body contact 31, and a power supply 36 is coupled to the substrate contact 29. The power supply 34 can electrically bias the body contact 31 independent of the bias voltage placed on the substrate contact 29, and vice-versa. In an alternative embodiment, the body contact 31 and the substrate contact 29 may both be biased by the power supply 36 instead of different power supplies.

In an embodiment, the power supply 34 may be configured to supply a negative bias voltage to the body contact 31. In an embodiment, the power supply 34 may be configured to supply a negative bias voltage in a range of about −1 volts to about −4 volts to the body contact 31. In an embodiment, the power supply 34 may be configured to supply a negative bias voltage substantially equal to −2.5 volts to the body contact 31. In an embodiment, the power supply 34 may be configured to supply a negative bias voltage equal to −2.5 volts to the body contact 31.

In an embodiment, the power supply 36 may be configured to supply a negative bias voltage to the substrate contact 29. In an embodiment, the power supply 36 may be configured to supply a negative bias voltage in a range of about −1 volts to about −4 volts to the substrate contact 29. In an embodiment, the power supply 36 may be configured to supply a negative bias voltage substantially equal to −2.5 volts to the substrate contact 29. In an embodiment, the power supply 36 may be configured to supply a negative bias voltage equal to −2.5 volts to the substrate contact 29. In an embodiment, the negative bias voltage supplied from the power supply 34 to the body contact 31 may be equal or substantially equal to the negative bias voltage supplied from the power supply 36 to the substrate contact 29.

In use, a negative bias voltage is supplied from the power supply 34 to the body contact 31, and a negative bias voltage (e.g., −2.5 volts) is supplied from the power supply 36 to the substrate contact 29. This biasing scheme contrasts with conventional biasing schemes in which the semiconductor substrate 10 is grounded (e.g., zero (0) volts). Biasing the substrate contact 29 with a negative bias voltage may reduce the leakage current from the semiconductor body 30 to the semiconductor substrate 10 while avoiding the need for an silicon-on-insulator substrate or a triple well isolation scheme for the field-effect transistor 20.

Figure 3:
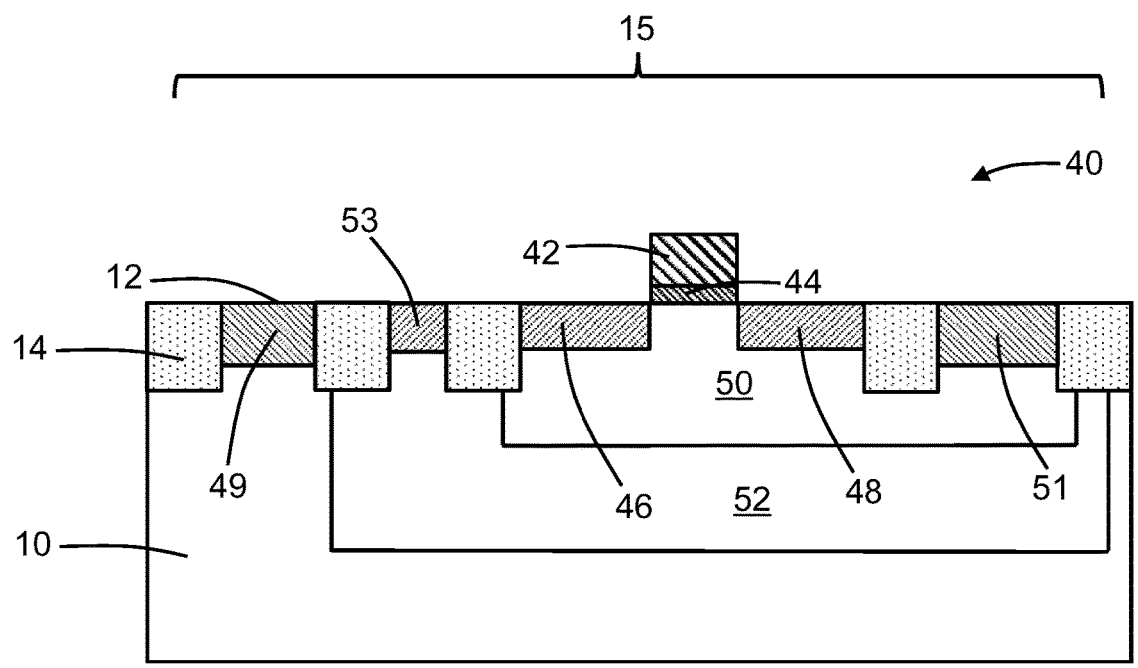
FIG. 3 is a cross-sectional view of a structure for a field-effect transistor in accordance with embodiments of the invention.

With reference to FIG. 3 and in accordance with embodiments of the invention, a field-effect transistor 40 may be formed as a semiconductor device structure in a different device region 15 of the semiconductor substrate 10 than the device region 16 (FIG. 1) of the semiconductor substrate 10 used to form the field-effect transistor 20 (FIGS. 1, 2). The isolation layer 18 is absent from the device region 15 and, therefore, is not located beneath the field-effect transistor 40.

The field-effect transistor 40 may be formed by bulk CMOS processes as a semiconductor device structure in the device region 16 of the semiconductor substrate 10. The field-effect transistor 40 may include a gate electrode 42 comprised of a conductor, such as doped polycrystalline silicon (i.e., polysilicon) or a work function metal, and a gate dielectric 44 comprised of an electrical insulator, such as silicon dioxide or hafnium oxide. The gate electrode 42 and associated gate dielectric 44 may be formed by depositing a layer stack and patterning the layer stack with photolithography and etching processes. The field-effect transistor 40 may further include halo regions, lightly-doped drain extensions, a source region 46, a drain region 48, a semiconductor body 50 provided by a portion of the semiconductor substrate 10, and sidewall spacers on the gate electrode 42. A body contact 51 is coupled to the portion of the semiconductor substrate 10 providing the semiconductor body 50, and a substrate contact 49 is coupled to a portion of the semiconductor substrate 10 that is electrically isolated from the semiconductor body 50.

The source region 46 and drain region 48 are doped to have an opposite conductivity type from the semiconductor substrate 10 and semiconductor body 50. In an embodiment, the field-effect transistor 40 may be an n-type field-effect transistor. In that instance, the source region 46 and drain region 48 may contain semiconductor material doped with an n-type dopant to provide n-type electrical conductivity, and the semiconductor substrate 10, substrate contact 49, semiconductor body 50, and body contact 51 may contain semiconductor material doped with a p-type dopant to provide p-type electrical conductivity. In alternative embodiments, the polarity type of the dopants may be swapped such that the field-effect transistor 40 is a p-type field-effect transistor instead of an n-type field-effect transistor. In an embodiment, the source region 46 and drain region 48 may be formed by ion implantation, and the substrate contact 49 and body contact 51 may be formed by a separate ion implantation.

A deep well 52 is formed in a portion of the semiconductor substrate 10 beneath the semiconductor body 50, and has an opposite conductivity type from the semiconductor substrate 10 and semiconductor body 50. A deep well contact 53 is formed that is coupled to the deep well 52. The substrate contact 49, the body contact 51, and the deep well contact 53 are electrically isolated from each other and from the semiconductor body 50 by the shallow trench isolation regions 14. The deep well 52 electrically isolates the semiconductor body 50 from the portion of the semiconductor substrate 10 that is electrically coupled to the substrate contact 49.

The deep well 52 may be part of a triple well isolation scheme for the field-effect transistor 40. In an embodiment in which the semiconductor substrate 10 and semiconductor body 50 contain p-type semiconductor material, the deep well 52 and the deep well contact 53 may contain semiconductor material doped with an n-type dopant to provide n-type electrical conductivity. The deep well 52 may be formed by a masked ion implantation before forming the field-effect transistor 40, and the deep well contact 53 may also be formed by a masked ion implantation before forming the field-effect transistor 40. A diode is defined at a p-n junction between the semiconductor body 50 and the deep well 52. Another diode is defined at a p-n junction between deep well 52 and the portion of the semiconductor substrate 10 that is electrically isolated from the semiconductor body 50.

Figure 4:
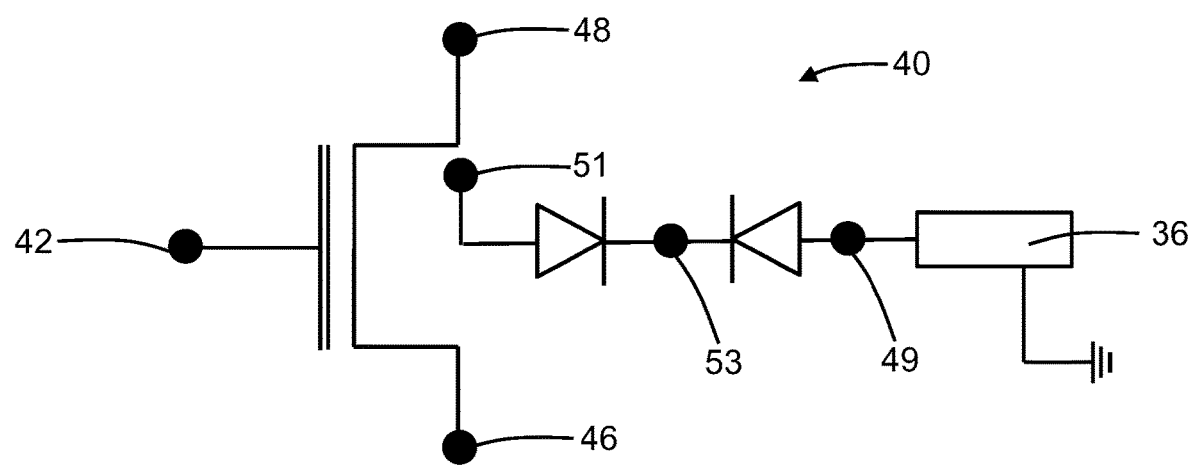
FIG. 4 is a circuit schematic of the field-effect transistor of FIG. 3.

With reference to FIG. 4 in which like reference numerals refer to like features in FIG. 3 and in accordance with embodiments of the invention, the power supply 36 is coupled to the substrate contact 49, and may be configured to supply a negative bias voltage to the substrate contact 49. In an embodiment, the power supply 36 may be configured to supply a negative bias voltage in a range of about −1 volts to about −4 volts to the substrate contact 49. In an embodiment, the power supply 36 may be configured to supply a negative bias voltage substantially equal to about −2.5 volts to the substrate contact 49. In an embodiment, the power supply 36 may be configured to supply a negative bias voltage equal to −2.5 volts to the substrate contact 49.

In use, the body contact 51 may be coupled to ground in order to ground the semiconductor body 50, a voltage equal to a positive supply voltage may be supplied to the deep well contact 53, and a negative bias voltage (e.g., −2.5 volts) may be supplied from the power supply 36 to the substrate contact 49. This biasing scheme contrasts with conventional triple well biasing schemes in which the semiconductor substrate 10 is grounded (e.g., zero (0) volts).

Figure 5:
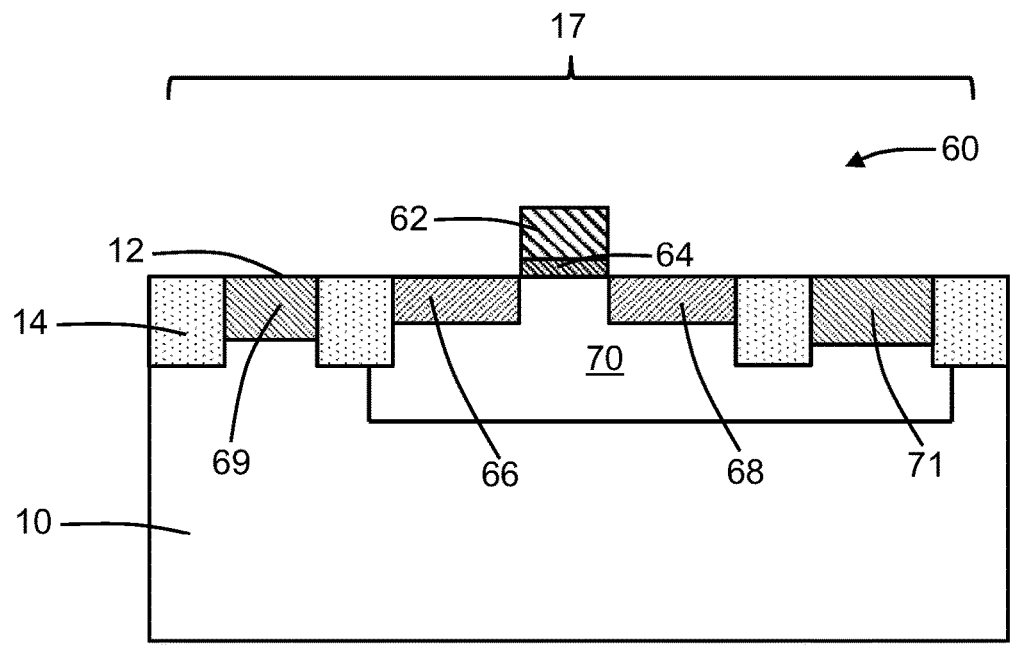
FIG. 5 is a cross-sectional view of a structure for a field-effect transistor in accordance with embodiments of the invention.

With reference to FIG. 5 and in accordance with embodiments of the invention, a field-effect transistor 60 may be formed as a semiconductor device structure in a different device region 17 of the semiconductor substrate 10 than the device region 16 (FIG. 1) of the semiconductor substrate 10 used to form the field-effect transistor 20 (FIGS. 1, 2) and the device region 15 (FIG. 3) of the semiconductor substrate 10 used to form the field-effect transistor 40 (FIGS. 3, 4). The isolation layer 18 is absent from the device region 17 and, therefore, is not located beneath the field-effect transistor 60.

The field-effect transistor 60 may be formed by bulk CMOS processes as a semiconductor device structure in the device region 17 of the semiconductor substrate 10. The field-effect transistor 60 may include a gate electrode 62 comprised of a conductor, such as doped polycrystalline silicon (i.e., polysilicon) or a work function metal, and a gate dielectric 64 comprised of an electrical insulator, such as silicon dioxide or hafnium oxide. The gate electrode 62 and associated gate dielectric 64 may be formed by depositing a layer stack and patterning the layer stack with photolithography and etching processes. The field-effect transistor 60 may further include halo regions, lightly-doped drain extensions, a semiconductor body 70 provided by a portion of the semiconductor substrate 10, a source region 66, a drain region 68, and sidewall spacers on the gate electrode 62. A body contact 71 is coupled to the portion of the semiconductor substrate 10 providing the semiconductor body 70, and a substrate contact 69 is coupled to a portion of the semiconductor substrate 10 that is electrically isolated from the semiconductor body 70.

The source region 66 and drain region 68 are doped to have an opposite conductivity type from the semiconductor body 70 and body contact 71. In an embodiment, the field-effect transistor 60 may be a p-type field-effect transistor. In that instance, the source region 66, drain region 68, semiconductor substrate 10, and substrate contact 69 may contain semiconductor material doped with a p-type dopant to provide p-type electrical conductivity, and the semiconductor body 70, and body contact 71 may contain semiconductor material doped with an n-type dopant to provide n-type electrical conductivity. In alternative embodiments, the polarity types of the different dopants may be swapped to such that the field-effect transistor 60 is an n-type field-effect transistor instead of a p-type field-effect transistor. In an embodiment, the source region 66 and drain region 68 may be formed by ion implantation, and the substrate contact 69 and body contact 71 may be formed by a separate ion implantation.

The semiconductor body 70 may be provided by a well that is formed in the semiconductor substrate 10 and that has an opposite conductivity type from the semiconductor substrate 10 so as to provide electrical isolation. In an embodiment in which the semiconductor substrate 10 contains p-type semiconductor material, the well providing the semiconductor body 70 may contain semiconductor material doped with an n-type dopant to provide n-type electrical conductivity. A diode is defined at a p-n junction between the semiconductor body 70 and the semiconductor substrate 10.

Figure 6:
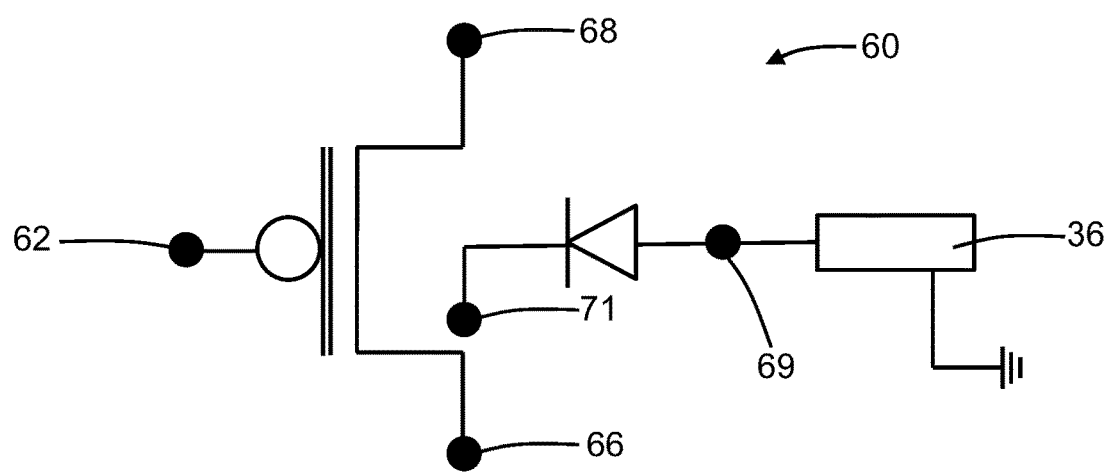
FIG. 6 is a circuit schematic of the field-effect transistor of FIG. 5.

With reference to FIG. 6 in which like reference numerals refer to like features in FIG. 5 and in accordance with embodiments of the invention, the power supply 36 is coupled to the substrate contact 69, and may be configured to supply a negative bias voltage to the substrate contact 69. In an embodiment, the power supply 36 may be configured to supply a negative bias voltage in a range of about −1 volts to about −4 volts to the substrate contact 69. In an embodiment, the power supply 36 may be configured to supply a negative bias voltage substantially equal to about −2.5 volts to the substrate contact 69. In an embodiment, the power supply 36 may be configured to supply a negative bias voltage equal to −2.5 volts to the substrate contact 69.

In use, the body contact 71 may be coupled to a positive supply voltage, and a negative bias voltage (e.g., −2.5 volts) may be supplied from the power supply 36 to the substrate contact 69. This biasing scheme contrasts with conventional biasing schemes in which the semiconductor substrate 10 surrounding the semiconductor body 70 is grounded (e.g., zero (0) volts).

In an embodiment, the field-effect transistor 20 may be a non-triple-well n-type field-effect transistor switch, and the field-effect transistor 40 and the field-effect transistor 60 may be elements of a logic library in which the field-effect transistor 40 is a triple-well field-effect transistor and the field-effect transistor 60 is a p-type field-effect transistor. The field-effect transistors 20, 40, 60 may be considered to be non-SOI devices that are formed using a non-SOI silicon high-resistivity bulk semiconductor substrate.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a bulk semiconductor substrate including a device region;
   a substrate contact coupled to a portion of the bulk semiconductor substrate in the device region, the substrate contact configured to be biased with a first negative bias voltage;
   a field-effect transistor including a semiconductor body in the device region of the bulk semiconductor substrate, the semiconductor body electrically isolated from the portion of the bulk semiconductor substrate; and
   an isolation layer positioned between the semiconductor body and the portion of the bulk semiconductor substrate, the isolation layer comprising a polycrystalline semiconductor material.

2. The structure of claim 1 wherein the isolation layer has an electrical resistivity within a range of about 10,000 ohm-cm to about 1,000,000 ohm-cm.

3. The structure of claim 1 further comprising:
   a power supply coupled to the substrate contact, the power supply configured to supply the first negative bias voltage to the substrate contact.

4. The structure of claim 1 wherein the first negative bias voltage is within a range of about −1 volts to about −4 volts.

5. The structure of claim 1 wherein the bulk semiconductor substrate has an electrical resistivity within a range of about 1,000 ohm-cm to about 50,000 ohm-cm.

6. The structure of claim 1 further comprising:
a body contact coupled with the semiconductor body, the body contact configured to be biased with a second negative bias voltage, and the second negative bias voltage being substantially equal to the first negative bias voltage.

7. A method comprising:
forming a substrate contact coupled to a first portion of a bulk semiconductor substrate in a device region;
forming a first field-effect transistor including a semiconductor body in the device region of the bulk semiconductor substrate; and
forming an isolation layer positioned between the semiconductor body and the first portion of the bulk semiconductor substrate, wherein the semiconductor body is electrically isolated from the first portion of the bulk semiconductor substrate, the isolation layer comprises a polycrystalline semiconductor material, and the substrate contact is configured to be biased with a negative bias voltage relative to ground.

8. The method of claim 7, wherein forming the isolation layer positioned between the semiconductor body and the first portion of the bulk semiconductor substrate comprises:
forming amorphous semiconductor material in a second portion of the bulk semiconductor substrate; and
performing a thermal treatment to form the polycrystalline semiconductor material of the isolation layer from the amorphous semiconductor material.

9. The structure of claim 1 wherein the first negative bias voltage is relative to ground.

* * * * *